United States Patent [19]
Tedrow et al.

[11] Patent Number: 5,553,030
[45] Date of Patent: Sep. 3, 1996

[54] METHOD AND APPARATUS FOR CONTROLLING THE OUTPUT VOLTAGE PROVIDED BY A CHARGE PUMP CIRCUIT

[75] Inventors: Kerry D. Tedrow, Orangevale; Cesar Galindo, Stockton, both of Calif.

[73] Assignee: Intel Corporation, Santa Clara, Calif.

[21] Appl. No.: 491,792

[22] Filed: Jun. 19, 1996

Related U.S. Application Data

[62] Division of Ser. No. 119,870, Sep. 10, 1993, abandoned.

[51] Int. Cl.$^6$ ................................................. G11C 7/00
[52] U.S. Cl. ........................................ 365/226; 365/185.33
[58] Field of Search ............................. 365/226, 185.33; 307/296.1, 296.2, 296.3, 296.6, 482; 327/536, 537, 534, 535

[56] References Cited

U.S. PATENT DOCUMENTS

| | | | |
|---|---|---|---|
| 4,356,412 | 10/1982 | Moench et al. | 327/537 |
| 4,843,256 | 6/1989 | Scade | 327/536 |
| 5,003,197 | 3/1991 | Nojima et al. | 327/536 |
| 5,153,854 | 10/1992 | Herold | 365/185 |
| 5,157,278 | 10/1992 | Min et al. | 307/296.2 |
| 5,216,588 | 6/1993 | Bajwa et al. | 365/226 |
| 5,243,561 | 9/1993 | Yamauchi | 365/189.12 |
| 5,245,572 | 9/1993 | Kosonocky | 365/189.2 |
| 5,267,218 | 11/1993 | Elbert | 365/226 |
| 5,276,646 | 1/1994 | Kim et al. | 365/226 |
| 5,313,429 | 5/1994 | Chevallier et al. | 365/226 |

OTHER PUBLICATIONS

1992 IEEE International Solid–State Circuits Conference, ISSCC 92 Session 9/Non–Volatile and Dynamic RAMS/ Paper 9.3, "TP9.3: A 5V–Only 0.6 μm Flash EEPROM with ROW Decoder Scheme in Triple–Well Structure," Masao Kurlyama, et al., pp. 152–153, 270.

*Primary Examiner*—A. Zarabian
*Attorney, Agent, or Firm*—Blakely, Sokoloff, Taylor & Zafman

[57] ABSTRACT

An integrated circuit arrangement for providing operating voltages for a flash EEPROM memory array, which integrated circuit arrangement utilizes a plurality of charge pumps in a staggered output arrangement to generate a high voltage output while generating lower amounts of current from each individual charge pump so that the provision of the necessary current is integrated over the entire period of the voltage output. Unique circuitry is provided for regulating the value of the output voltage produced by the arrangement in response to variations in the output voltage produced.

13 Claims, 7 Drawing Sheets

5,553,030

METHOD AND APPARATUS FOR CONTROLLING THE OUTPUT VOLTAGE PROVIDED BY A CHARGE PUMP CIRCUIT

This is a continuation of application Ser. No. 08/119,870, filed Sep. 10, 1993 abandoned.

BACKGROUND OF THE INVENTION

1. Field of the Invention

This invention relates to computer systems and, more particularly, to methods and apparatus for controlling the output voltage produced by charge pumps used for programming and erasing flash electrically-erasable programmable read only memory (flash EEPROM) arrays.

2. History of the Prior Art

There has been a recent trend toward lowering the power requirements of portable computers. In order to reduce power consumption, much of the integrated circuitry used in personal computers is being redesigned to run at low voltage levels. The circuitry and components used in portable computers are being designed to operate at voltage levels such as 5 volts and 3.3 volts. This helps a great deal to reduce the power needs of such computers.

However, some of the features of portable computers require higher voltages. Recently, flash electrically-erasable programmable read only memory (flash EEPROM memory) has been used to store BIOS processes. This memory may be erased and reprogrammed without removing the BIOS circuitry from the computer by running a small update program when the BIOS processes are changed. However, erasing and reprogramming flash EEPROM memory requires approximately twelve volts to accomplish effectively; and the lower voltage batteries provided in personal computers are not capable of furnishing this voltage. In other electronic arrangements, charge pump circuits have been used to provide a high voltage from a lower voltage source. However, even though charge pumps have long been available which are capable of providing the voltages necessary for programming and erasing flash EEPROM memory arrays, no arrangement had been devised until recently for utilizing these charge pumps to provide the voltages needed to accomplish erasing and programming of flash EEPROM memory arrays using those positive source erase techniques which are used when 12 volts is available from an external source.

The primary reason for the failure is the universal perception that insufficient current can be generated using charge pumps to accomplish the erase process. The positive source method of erasing flash EEPROM memories draws a very substantial amount of current. However, recently it was discovered that using specially designed charge pumps sufficient current could be generated to accomplish positive source erase of flash EEPROM memory arrays. A charge pump arrangement for accomplishing positive source erase is disclosed in detail in U.S. patent application Ser. No. 08/119,719, entitled *Method And Apparatus For Programming And Erasing Flash EEPROM Memory Arrays Utilizing A Charge Pump Circuit*, K. Tedrow et al, filed on even date herewith, and assigned to the assignee of the present invention.

One of the problems encountered in utilizing charge pumps is that the output of a charge pump is furnished in a series of charge pulses which are stored to provide a source voltage. The charge pump generates this form of output because the output stage functions in the manner of a diode which only transfers charge to the output in the forward biased condition. This creates a voltage ripple on the output of the pump when the current requirements are high relative to the capacitance of the load. Another drawback is that power supply noise can be created because the inductance of bond wires and lead frames produces spikes in the internal supply voltage with the pulsing output current provided by the charge pump. The variation in the voltage Vcc provided may be sufficient to cause internal switching of devices. These two different problems make it desirable to attempt to smooth the output voltage provided by the charge pumps described in the copending patent application.

SUMMARY OF THE INVENTION

It is, therefore, an object of the present invention to provide an arrangement for smoothing the output voltage produced by charge pumping apparatus used for erasing and programming flash EEPROM memory arrays.

It is another object of the present invention to provide an arrangement for regulating the output voltage provided by charge pumps for generating the high voltages and currents necessary for erasing flash EEPROM memory arrays.

These and other objects of the present invention are realized in an integrated circuit arrangement which utilizes a plurality of charge pumps in a staggered output arrangement to generate a high voltage output while generating lower amounts of current from each individual charge pump so that the provision of the necessary current is integrated over the entire period of the voltage output. Unique circuitry is provided for regulating the value of the output voltage produced by the arrangement.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to a method for operating a computer in processing electrical or other (e.g. mechanical, chemical) physical signals to generate other desired physical signals.

DETAILED DESCRIPTION

Figure 1:
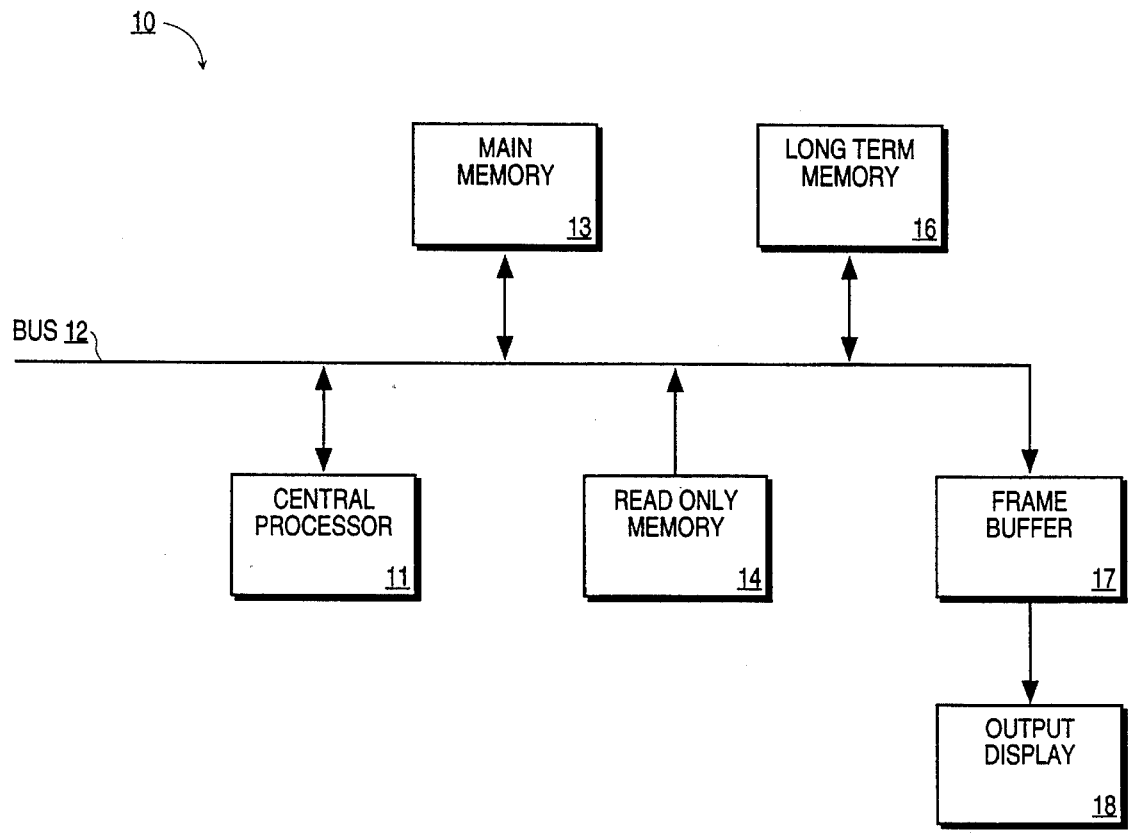
FIG. 1 is a block diagram illustrating a computer system which may utilize the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. If the memory 14 is constructed of flash EEPROM memory cells, it may be modified by running an update process on the computer itself to reprogram the values stored in the memory 14. Typically, such flash EEPROM memory will include circuitry for programming and erasing the memory array.

Also connected to the bus 12 are various peripheral components such as long term memory 16 and circuitry such as a frame buffer 17 to which data may be written which is to be transferred to an output device such as a monitor 18 for display. The construction and operation of long term memory 16 (typically an electro-mechanical hard disk drive) is well known to those skilled in the art. However, rather than the typical electro-mechanical hard disk drive, a flash EEPROM memory array may be used as the long term memory 16, Such flash EEPROM memory arrays are programmed and erased through techniques which utilize voltages greater than those typically available to the integrated circuits of more advanced portable computers. Such flash EEPROM memory arrays typically include circuitry for programming and erasing the memory array. Consequently, in accordance with the present invention, such long term memory arrays as well as memory 14 may provide circuitry for generating high voltages from the lower voltages available from the batteries typically utilized with such computers.

A flash EEPROM memory array is made up of memory cells which include floating gate field effect transistor devices. Such memory transistors may be programmed to change the charge stored on the floating gate, and the condition of the transistors (programmed or erased) may be detected by interrogating the cells. The conventional method of erasing an array of flash EEPROM memory cells (called positive source erase) erases all of the cells together (or at least some large block thereof). Typically, this requires the application of twelve volts to the source terminals of all of the memory cells, the grounding of the gate terminals, and the floating of the drain terminals. The programming of memory cells is typically accomplished a word at a time but conventionally requires that the drain terminals of selected cells be placed at six or seven volts, the gate terminals at eleven or twelve volts, and the source terminals at ground.

Although it has been typical to provide charge pumps to generate higher voltages when only lower voltages are available, charge pumps have not been used for erasing and programming flash EEPROM memory arrays using conventional methods. Although such charge pumps are able to raise the voltage to an appropriate level, prior art charge pumps were not felt to provide sufficient current to effectively erase and program flash EEPROM memory when erased in the conventional positive source manner without the provision of very large capacitors which would occupy too much die area to be practical.

Figure 2:
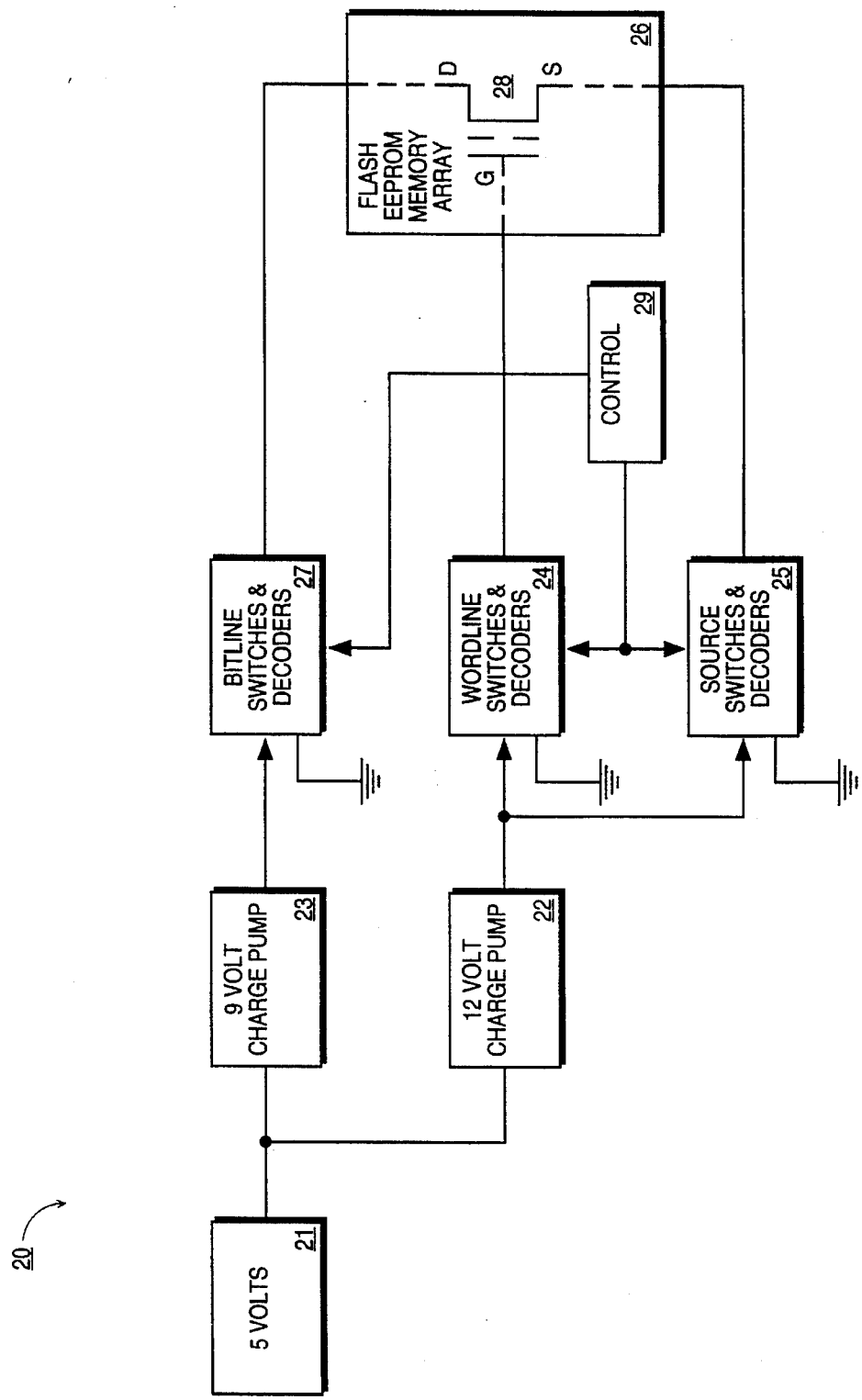
FIG. 2 is a block diagram of a circuit for providing programming and erase voltages for flash EEPROM memory arrays.

FIG. 2 is a block diagram which illustrates an integrated circuit 20 including a flash EEPROM memory array 26 and circuitry for programming and erasing the flash EEPROM memory array 26 utilizing positive source erase techniques. This circuit 20 includes a source of voltage 21 such as a low powered battery capable of furnishing five volts. Voltage from the source 21 is provided to a pair of charge pump circuits 22 and 23. The charge pump circuit 22 is devised to provide a pumped output voltage of approximately twelve volts while the charge pump circuit 23 is devised to produce a pumped output voltage of approximately nine volts.

Voltage from the charge pump 22 is furnished to a set of wordline switches and decoders 24 which, in a manner well known to those skilled in the art, may provide voltages at the gate terminals of flash EEPROM memory transistor devices 28 (only one transistor device 28 is illustrated in FIG. 2). Voltage from the pump 22 may also be furnished to a set of source switches and decoders 25 which, in a manner well known to those skilled in the art, provide voltages at the source terminals of flash EEPROM memory transistor devices 28. The voltage furnished by the pump 23 is furnished to a set of bitline switches and decoders 27 which, in a manner well known to those skilled in the art, provide voltages at the drain terminals of flash EEPROM memory transistor devices 28. Each of the sets of switches and decoders 24, 25, and 27 is controlled by signals from a control circuit 29 to provide appropriate voltages at erase and programming to accomplish those results. In one embodiment, the control circuit 29 is a microprocessor designed to provide control of all of the operations of the memory array 26 including reading, programming, and erasing among other things. The use of such a control circuit is described in U.S. patent application Ser. No. 08/086,186, entitled *Flash Memory Array System and Method*, M. Fandrich et al, filed Jun. 30, 1993, and assigned to the assignee of the present invention.

At the lower right corner of FIG. 2 is shown a table which includes the voltages which are typically applied through switches to the various terminals of the memory cells during the program and erase operations using positive source erase techniques. As may be seen, the erasing of the memory device 28 requires that a positive twelve volts be switched to the source terminal of the device 28, that ground be switched to the gate terminal, and that the drain terminal be floated. A N type flash EEPROM memory cell has a source region which is an N doped region surrounded by a P doped substrate. The P doped substrate is grounded so that a diode junction is formed at the junction separating the source and the substrate. When twelve volts is switched to the source terminal in the positive source erase process, the diode junction between the source and substrate is biased into the breakdown region so that substantial source current flows. In fact, the value of the source voltage is actually limited by the breakdown voltage to be no more than approximately ten volts (approximately two volts of the twelve volts available is dropped through the resistive switch to the source terminals) so that the junction will not be biased into a destructive breakdown region of operation. Because of this substantial source current when the erase process is conducted using positive source erase, the source of the erase voltage must be able to furnish a substantial amount of current. Prior to the invention of the copending patent application, it was not believed that a sufficient amount of current could be furnished by a charge pump.

Figure 3:
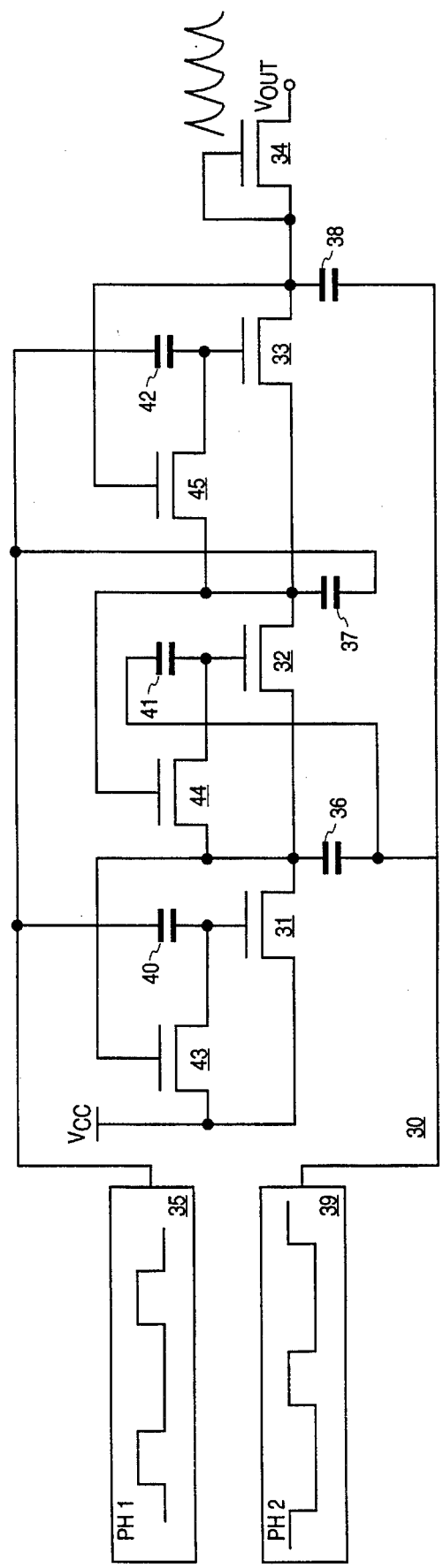
FIG. 3 is a block diagram of a charge pump which may be used in the circuit of FIG. 2 to provide voltages and currents sufficient for positive source erase techniques.

FIG. 3 illustrates a bootstrap pump arrangement 30 as described in the aforementioned copending patent application (entitled *Method And Apparatus For Programming And Erasing Flash EEPROM Memory Arrays Utilizing A Charge Pump Circuit*) which may be utilized to provide the high voltages and currents required for erasing and programming flash EEPROM memory arrays in accordance with this invention. As is shown in FIG. 3, the pump 30 includes a number of stages of N type field effect transistor devices 31, 32, 33, and 34 each having drain and source terminals connected in series between a source of voltage Vcc and an output terminal Vout. Input clock signals are furnished to the circuit 30 from a source of clock signals 39 via capacitors 36, 38, and 41. A second set of input clock signals are furnished from a source of clock signals 35 by capacitors 37, 40, and 42. Each stage of the circuit 30 includes an N channel field effect transistor device 43, 44, or 45 providing a path between source and drain terminals to the gate terminal of the associated device 31, 32, or 33 of that stage. In one embodiment of the circuit 30, the transistor devices 31, 32, and 33 as well as the other transistor devices 43, 44, and 45 are special N type devices referred to as S type devices. S type devices are basically N type devices having a very low threshold voltage level. The use and manufacture of S type devices are described in detail in U.S. Pat. Nos. 4,052,229; 4,096,584; 4,103,189; and 5,057,715.

The two phases of input clock pulses (phase 1 and phase 2) produced by the sources 35 and 39 are applied in a unique manner in order to allow the operation of the circuit 30 to produce the desired output voltages and currents. The two phase clock signals are chosen so that they do not overlap. It may be seen that the phase 2 clock is illustrated as high initially. When this clock is high, enabling signals are applied to the gate terminals of the control devices 43 and 45 and to the gate of switching device 32. These pulses turn the control devices 43 and 45 on. The high voltage from the source 39 is also applied at the drain of the device 32, and the high voltages at both the drain and gate of the device 32 cause it to turn on. When the device 32 goes on, its drain and gate are initially at the same value. The drain and gate have been brought to this value by the conduction of the device 44 during the immediately preceding period in which the phase 1 clock signal was high. However, since the phase 1 clock is now low, the control device 44 joining the drain and gate of the device 32 is off. Thus, after the device 32 has been on for any period, the high voltage at the drain transfers charge from the capacitor 36 to the capacitor 37, reducing the voltage level at the drain of the device 32. This causes the voltage at the gate of the device 32 to be higher than either the drain or the source; and the device 32 switches completely on without any threshold voltage drop. Thus, the transfer of charge from the capacitor 36 to the capacitor 37 does not dissipate power due to a threshold drop once the device 32 begins to turn on.

As the voltage at the drain and source of the device begin to equalize, the voltage at the gate of the control device 44 is raised so that the control device is nearly on. When the phase 2 clock pulse goes low, the device 44 turns on. The lowering of the voltage at the gate of the device 32 when the phase 2 pulse goes low causes the device 32 to begin to turn off. Simultaneously, the gate terminals of each of the control devices 43 and 45 are lowered turning off the devices 43 and 45 so that the drain and gate terminals of the devices 31 and 33 are isolated from each other. When the phase 1 clock pulse goes high, the device 44 switches completely on and equalizes the voltage at the gate and drain of the device 32. At the same time, the gate terminals of the devices 31 and 33 are raised by the value Vcc while the drain of the device 33 is raised by the value Vcc.

The devices 31 and 33 function similarly to the device 32 in transferring charge to the capacitors 36 and 38. The gate and drain terminals of these devices are initially equal, but then the drain voltage drops as charge is transferred to the capacitors 36 and 38 of the next stages so that the devices are switched completely on and experience no threshold voltage drop.

Thus, when the phase 1 clock goes high, the device 31 turns on; and current provided by the source Vcc charges the capacitor 36. When the phase 1 pulse goes low the device 31 switches off. Then the phase 2 clock pulse turns on the device 32; and the capacitor 36 provides stored charge and charge due to the phase 2 pulse to the capacitor 37. The device 32 switches off when the phase 2 pulse goes low. When the phase 1 pulse again goes high, the source Vcc again charges the capacitor 36. Simultaneously, the device 33 goes on and the capacitor 37 provides stored charge as well as the pulse from the phase 2 clock to charge a capacitor 38. When the phase 1 clock goes low, the device 33 turns off.

Ultimately, the charging of the capacitor 38 and the positive swing of the phase 2 clock pulse raise the voltage level on the capacitor 38 sufficiently above the level Vout to cause the conduction of the switching device 34. When the phase 2 clock goes high, the output device 34 turns on and furnishes a pumped voltage at Vout. It should be noted that the last stage operates in a range in which it exhibits a Vt drop.

This operation provides the desired output voltage while furnishing the high level of current necessary to erase and program flash EEPROM memory arrays. The three stage pump circuit 30 illustrated in FIG. 3 furnishes approximately N (where N is the number of stages) plus one times the voltage of the source Vcc at the output terminal less the Vt drop of the device 34. For example, with Vcc equal to 4.4 volts, an output voltage of 17.1 volts is furnished at the output of the pump circuit 30. Thus, as may be seen, the arrangement of FIG. 3 provides a reliable charge pump circuit capable of producing high levels of current.

It should be noted that the smaller charge pump 23 of FIG. 2 required to furnish the voltage used at the drain terminals of the flash EEPROM memory cells during programming of the array may be provided by charge pumps similar to the pump described in FIG. 3 with the exception that fewer stages are used. For example, a charge pump having only two stages is capable of providing a 9.5 volt output which may be used at the drain terminals of the memory cells during programming.

As will be apparent to those skilled in the art, the charge pump circuit of FIG. 3 provides an output which appears much like that illustrated in FIG. 3 because the device 34 only provides charge to the load when the device 34 is forward biased. This has two effects. First, the output voltage produced at the terminal Vout may have a substantial ripple when the current requirements are high relative to the capacitance of the load as is the case in erasing flash EEPROM memory arrays. Another drawback is that power supply noise can be created because of the inductance of bond wires and lead frames produce spikes in the internal supply voltage with the pulsing output current of the charge pump. The variation in Vcc may be sufficient to cause switching of transistor devices. These two different problems make it desirable to attempt to smooth the output voltage provided by the charge pumps of the copending invention.

In order to reduce the voltage ripple produced at the output of the charge pump 30 of FIG. 3, a plurality of charge pumps are utilized to provide the output voltage. The outputs of each of these charge pumps are connected together, and clock signals are provided to each of the charge pumps in a staggered series beginning with a first charge pump, moving to a next, then to a next, and so on until each has produced an output voltage; then the series repeats beginning with the first pump. This has the effect of providing a much more constant voltage at the output of the plurality of pumps while reducing the charge and current transferred by each individual pump and integrating the transfer of charge over the total clock period of any individual pump.

Figure 4:
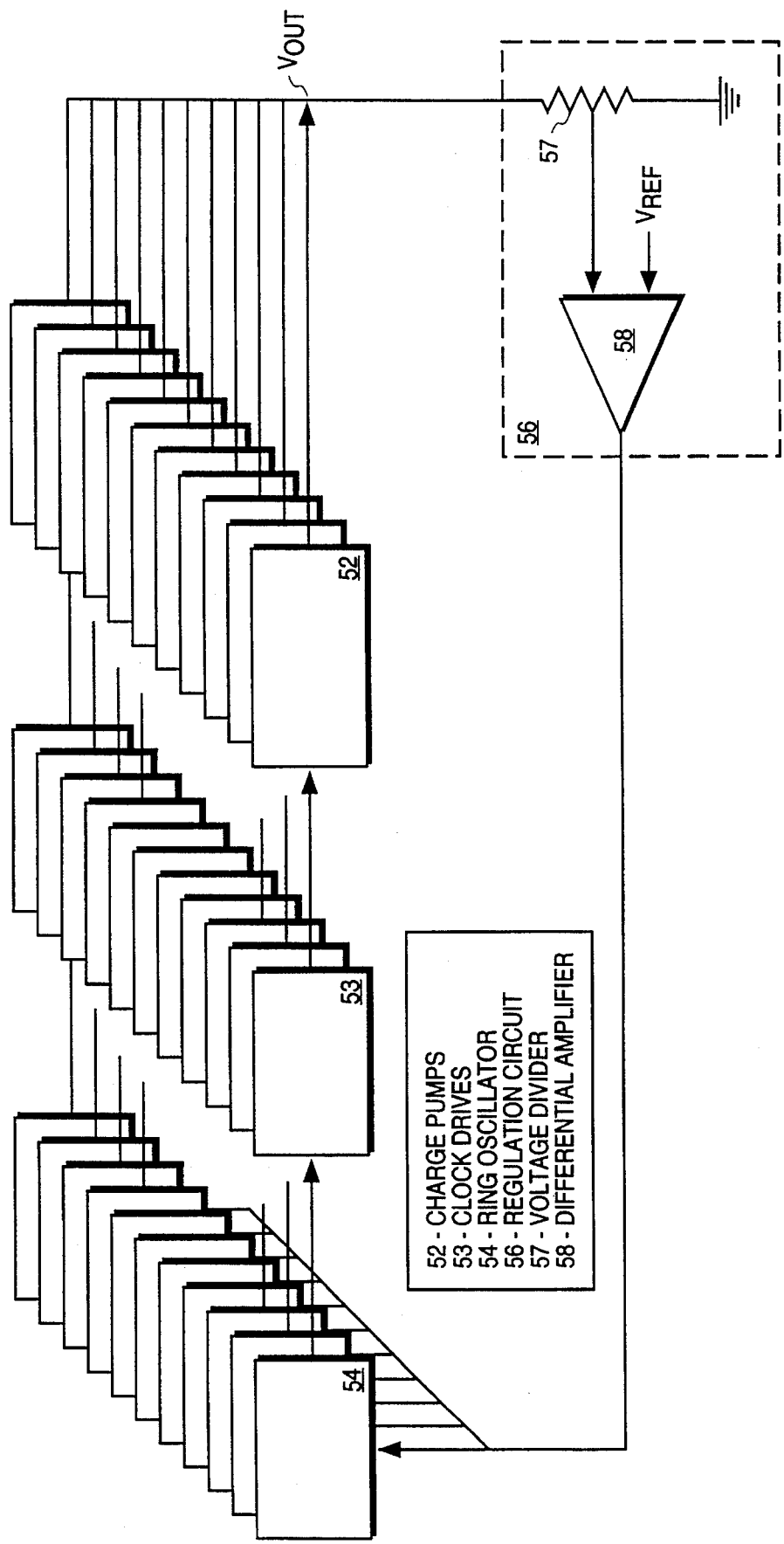
FIG. 4 is a block diagram of a circuit in accordance with the present invention for controlling the output voltage of a charge pump such as that illustrated in FIG. 3.

FIG. 4 illustrates an arrangement in accordance with the present invention for accomplishing the staggered production of output from a plurality of charge pumps as has been described. As may be seen, a plurality of charge pumps 52 provide voltage at an output terminal Vout. In one embodiment of the invention, eleven such charge pumps 52 are utilized. Each of these charge pumps receives clock input signals from one of eleven clock driver circuits 53. Each of the clock driver circuits 53 is driven by one of eleven different oscillators 54 connected in a ring to provide staggered input signals. The input to the oscillators 54 is provided by a regulation circuit 56 which is adapted to vary the rate of oscillation of the oscillator circuits 54 in response to differences in the output voltage produced by the charge pumps 52. If the voltage Vout supplied at the output of the charge pumps 52 fails, the regulation circuit 56 increases the rate of oscillation of the oscillator circuits 54 so that the output voltage Vout is returned to its desired value. The regulation circuit 56 includes a voltage divider circuit 57 which provides an output signal which is a measure of the actual output voltage Vout. This value is translated into a current value by a differential amplifier circuit 58 which includes a number of current mirroring circuits. The variation in current produced is utilized to operate the current controlled oscillator circuits 54.

Figure 5:
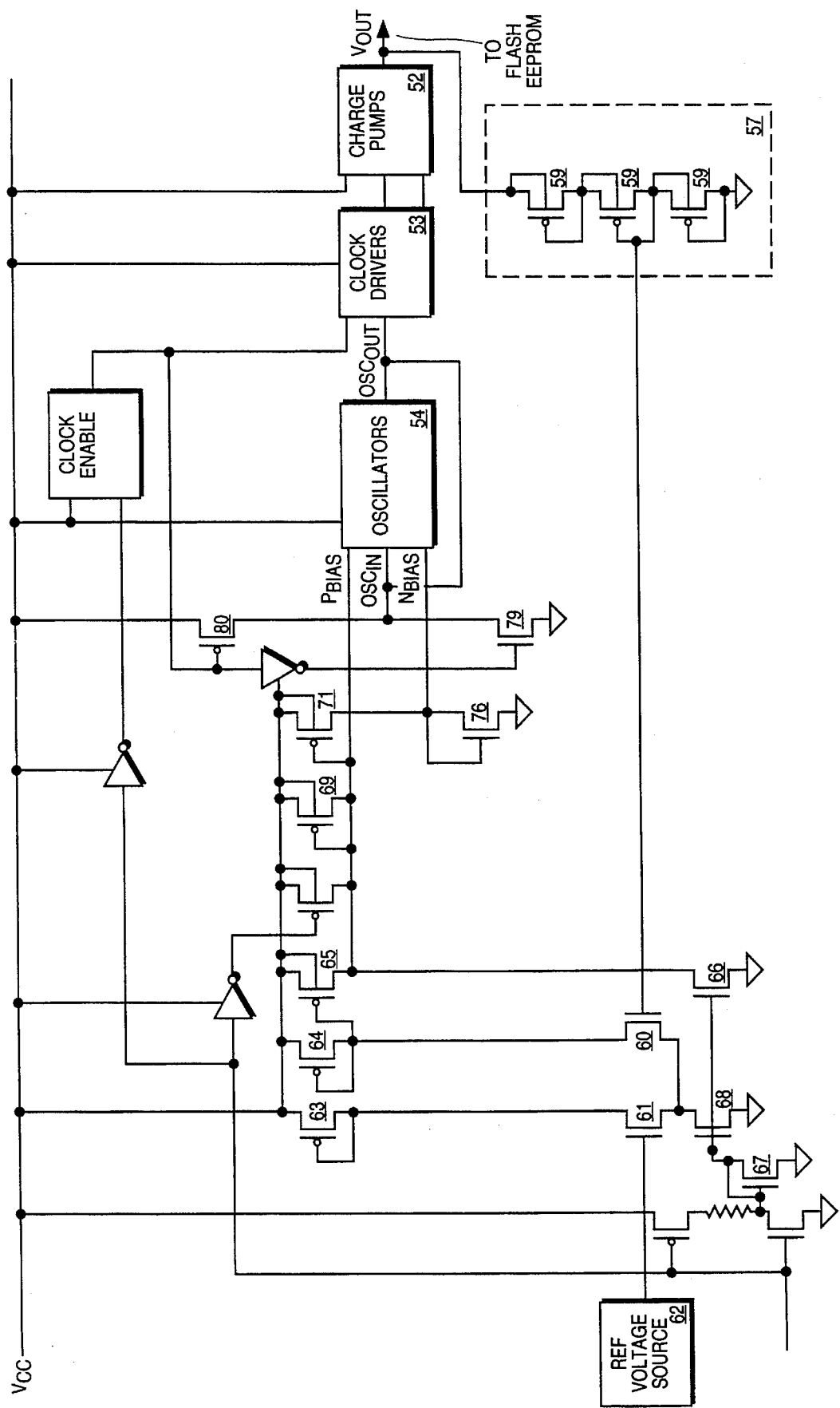
FIG. 5 is a circuit diagram illustrating the circuit of FIG. 4 in more detail.
Figure 8:
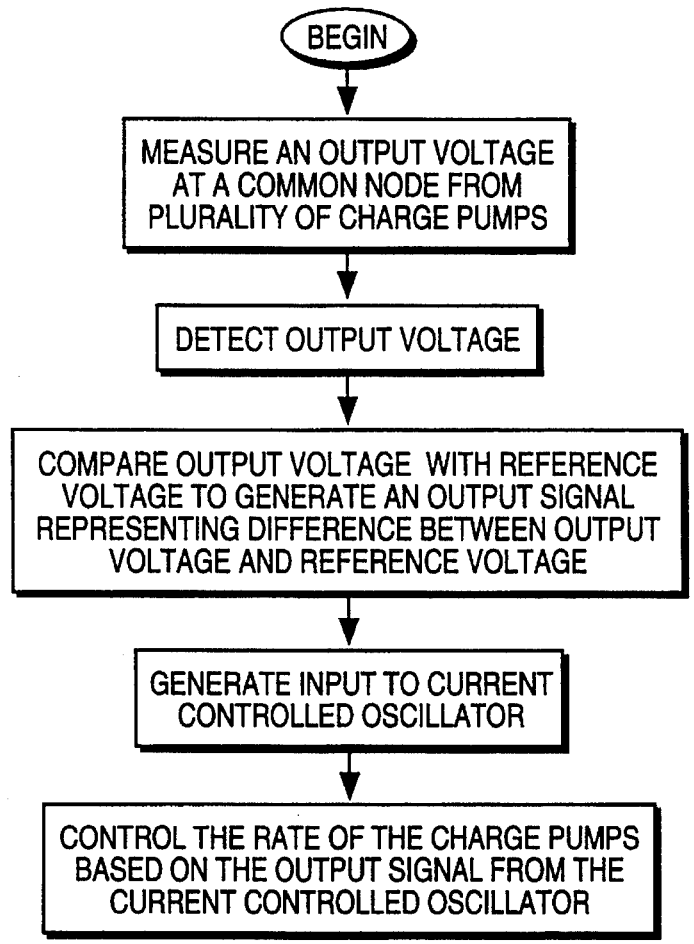
FIG. 8 is a flow chart illustrating a method of practicing the present invention.

FIG. 5 is a circuit diagram illustrating the voltage regulation circuit 56 shown in FIG. 4. FIG. 8 is a flow chart describing the method of operating the circuit of FIG. 5. As may be seen in FIG. 5, the voltage Vout at the output terminal connected to all of the plurality of individual charge pump circuits 52 is provided across the voltage divider circuit 57. In one embodiment, the circuit 57 includes three essentially identical P type integrated circuit field effect transistor devices 59 having their drain and source terminals connected in series between the source of Vout and ground. This arrangement causes one-third of the value of the voltage Vout at the output of the charge pumps 52 to appear across the lower transistor device 59 in the figure as one input to the differential amplifier circuit 58. This voltage is applied to the gate terminal of a N type field effect transistor device 60. A second input voltage is a reference voltage applied to the gate terminal of an N type field effect transistor device 61. The reference voltage is furnished from a source 62 of precise reference voltage designed in a manner well known to those skilled in the art.

Each of the devices 60 and 61 has its source terminal connected to the drain terminal of a N type field effect transistor device 68 which in turn has its source terminal joined to ground. The current through the device 68 limits the total current which may flow through the two devices 60 and 61. The current flowing through the device 60 also flows through a P type field effect transistor device 64 while the current flowing through the device 61 also flows through a P type field effect transistor device 63. The devices 63 and 64 are of identical sizes and are biased identically. Consequently, if the voltage at the output terminal Vout is of a desired value (twelve volts in one embodiment), the currents through each of the devices 60 and 61 are identical.

If the voltage at the output terminal Vout increases beyond the desired value, the voltage across the lower device 59 of the voltage divider 57 increases thereby increasing the voltage applied to the gate terminal of the device 60. The increased voltage at the gate terminal with respect to the source terminal causes the device 60 to transfer more current, a current greater than that transferred by the device 61. If the voltage at the output terminal Vout decreases below the desired value, the voltage across the lower device 59 decreases thereby decreasing the voltage applied to the gate terminal of the device 60. The decreased voltage at the gate terminal with respect to the source terminal causes the device 60 to transfer less current, a current less than that transferred by the device 61.

The device 64 is connected in a current mirror arrangement with another P type field effect transistor device 65. The device 65 is twice as large as the device 64 so transfers twice the current transferred by the device 64. The device 65 is in the same current path with a N type field effect transistor device 66. Also connected in the current path between Vcc and ground through the device 66 is output device 69, a P type field effect transistor device.

The current through the output device 69 is limited by the current which the device 66 can transfer. The device 66 is connected in a current mirror relationship with both of a N type field effect transistor device 67 and the N type field effect transistor device 68. The devices 66, 67, and 68 are of identical size; and the devices 66 and 68 are biased identically. The current through the device 66 is the same as the current through the device 68 which transfers the sum of the currents through the devices 60 and 61. Thus, when the currents through the devices 60 and 61 are equal, all of the current which the device 66 is able to conduct flows through the device 65 and no current flows through the output device 69.

When the current through the device 60 changes because of the change of the voltage Vout, the current through the device 64 changes identically, and the current through the device 65 changes in the same sense but twice as much. If the current through the device 65 increases, then the current through the device 69 must decrease; while if the current through the device 65 decreases, the current through the device 69 increases.

Figure 6:
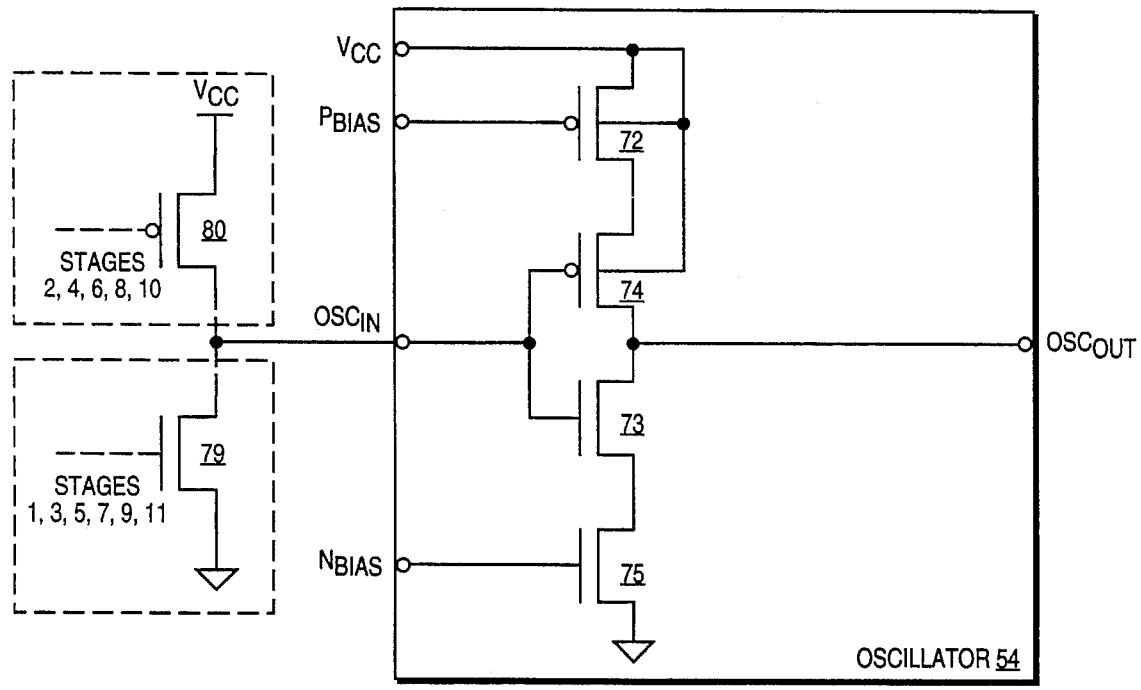
FIG. 6 is a circuit diagram illustrating a portion of the circuit of FIG. 4 in more detail.

The current through the device 69 is mirrored by two P type field effect transistor devices 71 and 72 each of which is identical in size to the device 69. The device 72 which is part of the oscillator stage 54 (shown in detail in FIG. 6) controls the current flow in the oscillator stages 54 from the source of current at Vcc to an inverter including a N type field effect transistor device 73 and a P type field effect transistor device 74 having source and drain terminals connected in series. A N type field effect transistor device 75 is connected to control the flow of current to ground through the inverter including the devices 73 and 74. The device 75 is in a current mirror arrangement with a N type field effect transistor device 76 which transfers the same current as the device 71 which in turn mirrors the current through the output device 69. In any case, when current increases or decreases through the device 69, the same change occurs in the current through each of the devices 72 and 75. Thus if the voltage at the output Vout increases, the current to the oscillator stages 54 through each of the devices 72 and 75 decreases. It should be noted that at equilibrium, no current flows through the device 69 and thus no current flows through the devices 72 and 75 and vice versa. Typically, when load current is being drawn, the charge pumps are producing an output voltage which is slightly less than the value at which the reference is set. Consequently, the charge pump will continue to generate charge to maintain the output voltage at a desired value when the erase or programming operations are occurring.

The particular current path selected depends on the input condition when a signal OSCin is applied. It should be noted that in FIG. 5, both a N type field effect transistor device 79 and a P type field effect transistor 80 are shown at the input OSCin of the oscillators 54. The ocsillators 54, in fact, include eleven essentially identical stages connected in a ring. The OSCin input to each of the 1, 3, 5, 7, 9, and 11 oscillator stages 54 is provided in an initial condition by only a N type field effect transistor device 79; the P type field effect transistor device 80 does not exist for these stages. The OSCin input to each of the 2, 4, 6, 8, and 10 oscillator stages 54 is provided in an initial condition by only a P type field effect transistor device 80; the N type field effect transistor device 79 does not exist for these stages. In the initial state before the oscillator stages 54 are functioning, each of the devices 79 and 80 in each stage is held on. This places ground at both the OSCin and OSCout terminals of the first (1) stage oscillator 54. A positive-going edge of a clock enable signal CEN is applied to the gate terminal of each of the P devices 80 in each of the 2, 4, 6, 8, and 10 oscillator stages 54 and is inverted and furnished to the gate terminal of each of the N devices 79 in each of the 0, 1, 3, 5, 7, 9, and 11 oscillator stages 54. This turns off each of the initializing devices 79 and 80 in each stage. Turning off the devices 79 which have held both the input and output of the first (1) oscillator stage at ground allows the output to move to whatever condition is dictated by the input. The ground condition at the input of the first (1) stage has been applied at the gate terminal of the device 74 in that stage. This causes the P type device 74 in the first (1) stage to conduct generating a high value signal OSCout. The high value signal out of the first (1) stage oscillator 54 is applied to the gate terminal of the N type device 73 in the second (2) stage oscillator 54. This causes the N type device 73 to conduct generating a low value signal OSCout from the second (2) stage.

After the initial rise of the clock enable signal, the devices 79 and 80 in each oscillator stage 54 are held off. Thus, the low value OSCin signal from the second (2) stage enables the device 74 causing a high value to be transferred as the OSCin signal to the next (3) stage. Each oscillator stage 54 in the ring of oscillator stages 54 transfers an inverted signal to the input of the next stage 54, and the final stage oscillator stage 54 transfers its inverted output signal as the OSCin signal to the first (1) stage.

The rate at which the OSCin signal is propagated through each oscillator stage 54 to the next stage is controlled by the current flowing through the conducting one of the devices 72 and 75 in that stage of the oscillator. Increased current increases the rate of the propagation while decreased current decreases the rate of the clock. This occurs because the quicker each stage turns on and transfers current to the next stage, the quicker the next stage turns on. This is reflected around the ring causing the first stage to ultimately turn off faster when it receives input from the last stage.

Figure 7:
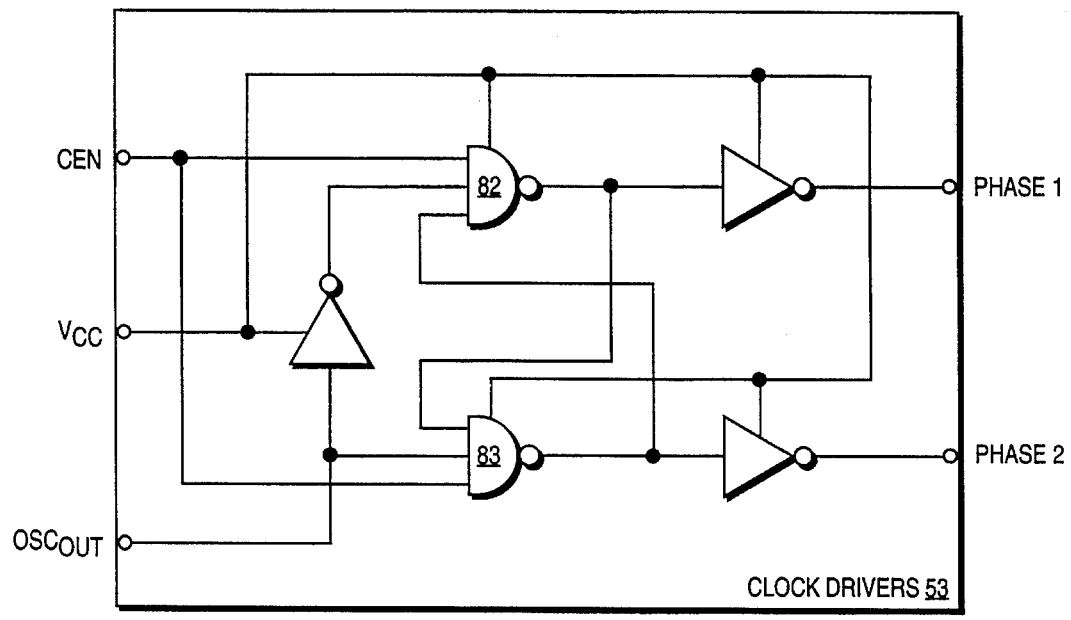
FIG. 7 is a circuit diagram illustrating another portion of the circuit of FIG. 4 in more detail.

The output of each oscillator stage 54 is transferred not only to the next oscillator stage but as one input to one of the clock driver circuits 53 shown in detail in FIG. 7. Each clock driver circuit 53 includes a pair of NAND gates 82 and 83. These NAND gates receive the output of the oscillator as a high or a low signal. These NAND gates also receive the clock enable signal CEN which is always high when the circuitry is operating. These NAND gates also receive the cross coupled output of the other one of the NAND gates. Because of the cross coupling of the output of each NAND gate to the input of the other NAND gate, each NAND gate can produce a low output only when the other NAND gate has ceased producing a low output. The outputs of the NAND gates 82 and 83 are inverted to produce the phase 1 and phase 2 clock signals used by the charge pump circuits 52. Since the clock drivers circuits receive staggered inputs from the oscillator circuits 54, each of the clock driver circuits produces staggered clock signals for operating the charge pump circuits 52.

In this way, the non-overlapping clock signals necessary to the operation of the stages of the staggered charge pump circuits 52 are produced. The non-overlapping clock signals assure that the charge on the gates of the charge pump stages will not be dissipated so that current will be transferred without a Vt drop.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A charge pump circuit comprising:
   (a) an oscillator providing a plurality of staggered output signals in response to a control signal, wherein a level of the control signal controls a rate of oscillation of the oscillator;

(b) a plurality of clock drivers generating clock pulses such that a frequency of each of the clock pulses is controlled by the output signals from the oscillator;

(c) a plurality of charge pumps for providing an output voltage at a common node in response to the frequency of each of the clock pulses, wherein the charge pumps are only controlled by the clock pulses generated by the clock drivers to generate the output voltage; and (d) a voltage regulator circuit comprising:
  (i) circuitry for measuring the output voltage; and
  (ii) a differential amplifier coupled (1) to the circuitry for measuring the output voltage and (2) directly to the oscillator, wherein the differential amplifier detects a difference between the output voltage and a reference voltage and correspondingly varies the rate of oscillation between a plurality of nonzero frequencies of the oscillator by varying the level of the control signal such that the output voltage remains substantially constant at a level proportional to the reference voltage.

2. The charge pump circuit of claim 1 wherein each of the plurality of charge pumps is a two phase bootstrap charge pump providing a positive output voltage.

3. The charge pump circuit of claim 1 wherein each of the clock drivers provides two non-overlapping phases of clock pulses.

4. The charge pump circuit of claim 1 wherein the oscillator comprises a ring oscillator having a number of stages equal to a number of the clock drivers.

5. The charge pump circuit of claim 1 wherein the circuitry for measuring the output voltage comprises a voltage divider.

6. The charge pump circuit of claim 5 wherein the voltage divider further comprises series-coupled field effect transistors.

7. A memory comprising:
(A) an array of memory cells;
(B) a charge pump circuit comprising:
  (1) an oscillator providing a plurality of staggered output signals in response to a control signal, wherein a level of the control signal controls a rate of oscillation of the oscillator;
  (2) a plurality of clock drivers generating clock pulses such that a frequency of each of the clock pulses is controlled by the output signals from the oscillator;
  (3) a plurality of charge pumps for providing an output voltage at a common node for the array of memory cells in response to the frequency of each of the clock pulses, wherein the charge pumps are only controlled by the clock pulses generated by the clock drivers to generate the output voltage; and
  (4) a voltage regulator circuit comprising:
    (a) circuitry for measuring the output voltage; and
    (b) a differential amplifier coupled (1) to the circuitry for measuring the output voltage and (2) directly to the oscillator, wherein the differential amplifier detects a difference between the output voltage and a reference voltage and correspondingly varies the rate of oscillation of the oscillator between a plurality of nonzero frequencies by varying the level of the control signal such that the output voltage remains substantially constant at a level proportional to the reference voltage.

8. The memory of claim 7 wherein the array of memory cells includes an array of floating gate field effect transistors.

9. The charge pump circuit of claim 7 wherein each of the plurality of charge pumps is a two phase bootstrap charge pump providing a positive output voltage.

10. The charge pump circuit of claim 7 wherein each of the clock drivers provides two non-overlapping phases of clock pulses.

11. The charge pump circuit of claim 7 wherein the oscillator comprises a ring oscillator having a number of stages equal to a number of the clock drivers.

12. A computer system comprising:
(A) a central processor;
(B) a memory coupled to the central processor, comprising:
  (1) an array of memory cells;
  (2) a charge pump circuit comprising:
    (a) an oscillator providing a plurality of staggered output signals in response to a control signal, wherein a level of the control signal controls a rate of oscillation of the oscillator;
    (b) a plurality of clock drivers generating clock pulses such that a frequency of each of the clock pulses is controlled by the output signals from the oscillator;
    (c) a plurality of charge pumps for providing an output voltage at a common node for the array of memory cells in response to the frequency of each of the clock pulses, wherein the charge pumps are only controlled by the clock pulses generated by the clock drivers to generate the output voltage; and
    (d) a voltage regulator circuit comprising:
      (i) circuitry for measuring the output voltage; and
      (ii) a differential amplifier coupled (1) to the circuitry for measuring the output voltage and (2) directly to the oscillator, wherein the differential amplifier detects a difference between the output voltage and a reference voltage and correspondingly varies the rate of oscillation of the oscillator between a plurality of nonzero frequencies by varying the level of the control signal such that the output voltage remains substantially constant at a level proportional to the reference voltage.

13. The memory of claim 12 wherein the array of memory cells includes an array of floating gate field effect transistors.

* * * * *